(12) United States Patent
Jin

(10) Patent No.: US 6,757,859 B1
(45) Date of Patent: Jun. 29, 2004

(54) PARALLEL TURBO TRELLIS-CODED MODULATION

(75) Inventor: Gary Q. Jin, Kanata (CA)

(73) Assignee: Zarlink Semiconductor Inc., Kanata (CA)

( * ) Notice: Subject to any disclaimer, the term of this patent is extended or adjusted under 35 U.S.C. 154(b) by 0 days.

(21) Appl. No.: 09/562,325

(22) Filed: May 1, 2000

(51) Int. Cl.[7] .................. H03M 13/29; H03M 13/45
(52) U.S. Cl. .................. 714/755; 714/780; 714/792; 714/796
(58) Field of Search .................. 714/755, 786, 714/792, 780, 794, 796

(56) References Cited

U.S. PATENT DOCUMENTS

| | | | | |
|---|---|---|---|---|
| 5,790,595 | A | * 8/1998 | Benthin et al. | 375/224 |
| 6,023,783 | A | 2/2000 | Divsalar | 714/792 |
| 6,128,765 | A | * 10/2000 | Ross et al. | 714/786 |
| 6,192,084 | B1 | * 2/2001 | Miyauchi et al. | 375/262 |
| 6,192,501 | B1 | * 2/2001 | Hladik et al. | 714/786 |
| 6,223,319 | B1 | * 4/2001 | Ross et al. | 714/755 |
| 6,226,773 | B1 | * 5/2001 | Sadjadpour | 714/794 |
| 6,263,467 | B1 | * 7/2001 | Hladik et al. | 714/755 |
| 6,304,996 | B1 | * 10/2001 | Van Stralen et al. | 714/796 |
| 6,343,368 | B1 | * 1/2002 | Lerzer | 714/796 |
| 6,381,727 | B1 | * 4/2002 | Ikeda | 714/780 |
| 6,400,290 | B1 | * 6/2002 | Langhammer et al. | 341/94 |
| 6,484,283 | B2 | * 11/2002 | Stephen et al. | 714/786 |
| 6,510,536 | B1 | * 1/2003 | Crozier et al. | 714/755 |
| 6,516,437 | B1 | * 2/2003 | Van Stralen et al. | 714/755 |

FOREIGN PATENT DOCUMENTS

| | | |
|---|---|---|
| WO | WO 98/52362 A2 | 11/1998 |
| WO | WO 00/22739 A1 | 4/2000 |

OTHER PUBLICATIONS

Kwon et al., "A Modified Two–Step Sova–Based Turbo Decoder for Low Power and High Performance", 1999 IEEE Tencon, pp. 297–300.*

* cited by examiner

Primary Examiner—Stephen M. Baker
(74) Attorney, Agent, or Firm—Marks & Clerk

(57) ABSTRACT

An encoder for turbo coded trellis code modulation comprises an encoder data block for storing incoming data, and at least two recursive systematic convolutional encoders, said convolutional encoders being connected to receive data in parallel from said encoder data block. The decoder also employs a parallel implementation.

14 Claims, 5 Drawing Sheets

PRIOR ART
(a) Normal RSC encoder used by turbo encoder RSC (15, 17)

(b) Parallel RSC encoder for RSC (15, 17)

PARALLEL TURBO TRELLIS-CODED MODULATION

Our co-pending patent application Ser. No. 09/562,322 of even date describes how turbo code can be used to code only the least significant bit (LSB) in the constellation and thereby achieve better performance than currently used trellis-coded modulation, such as Wei code. The achievable data rate is only a couple of dB away from Shannon capacity.

FIELD OF INVENTION

This invention relates to the field of digital communications, and in particular to an encoder and decoder for use in the implementation of a turbo trellis-coded modulation scheme.

BACKGROUND OF THE INVENTION

Turbo code has attracted a lot of interest due to its larger coding gain. See for example, "Application of Turbo Codes for Discrete Multi-Tone Modulation", Hamid R. Sadjapour, AT&T Shannon Labs., 1996. Turbo code consists of two or more convolutional constituent codes separated by an interleaver acting on the input sequence of the first encoder. In a digital subscriber loop (DSL) system, Turbo code can be used to replace trellis code to get better Bit-Error Rate (BER) performance. However, when the constellation size increases, the coding gain advantage of turbo code starts to reduce. This is because the redundant bits makes the constellation size even larger.

SUMMARY OF THE INVENTION

According to the present invention there is provided encoding apparatus generating a turbo trellis code modulation signal, comprising an encoder data block for storing incoming data, and at least two recursive systematic convolutional encoders, said convolutional encoders being connected to receive data in parallel from said encoder data block.

The described parallel implementation structure reduces the implementation cycle for both encoder and decoder. Also, the memory (RAM) requirement for the turbo decoder can also be saved by ⅓ in the case of a three bit parallel implementation.

The invention also provides decoding apparatus for a turbo coded trellis code modulation signal, comprising a pair of decoders performing forward and backward iteration on an input signal, and interleaver and de-interleaver, each decoder taking at n soft bit inputs for each turbo decoder iteration, where n is an integer greater than 1.

BRIEF DESCRIPTION OF THE DRAWINGS

The invention will now be described in more detail, by way of example only, with reference to the accompanying drawings, in which.

DETAILED DESCRIPTION OF THE INVENTION

Parallel Encoder

Figure 1:
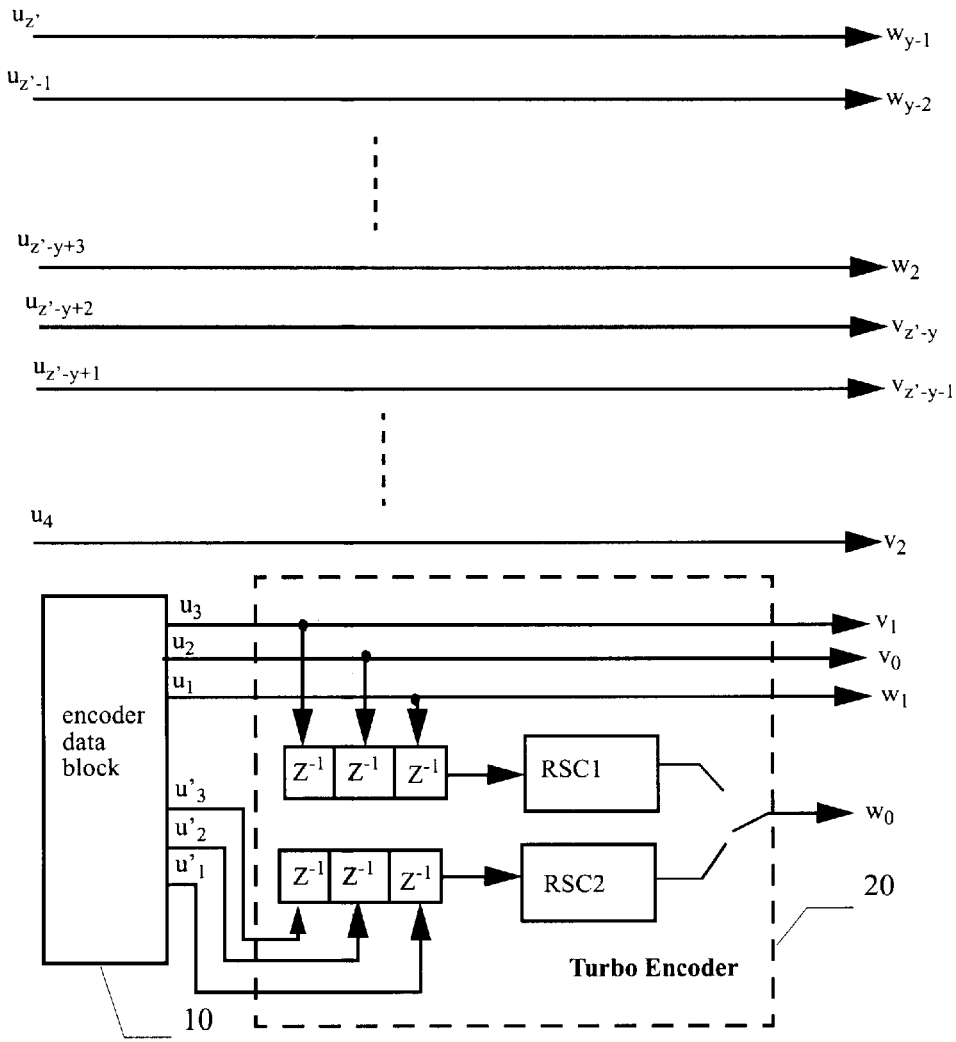
FIG. 1 is a block diagram of an encoder for turbo trellis code modulation.

The general constellation encoder structure for a turbo trellis-coded modulation scheme is shown in FIG. 1 for cases x>1 and y>1. The input binary word $u=(u_{z'}, u_{z'-1}, \ldots, u_1)$ determines two binary words $v=(v_{z'-y}, \ldots, v_0)$ and $w=(w_{y-1}, \ldots, w_0)$ (where $z'=x+y-1$), which are used to look up two constellation points in an encoder table.

Encoder data block 10 receives a portion of the data from an input bit stream and stores it in memory. The lowest order bits are read out of encoder data block and passed to recursive systematic convolutional encoders RSC1 and RSC2.

The turbo encoder formed by block 20 is a systematic encoder with coding rate ¾ punctured at rate ½. The turbo encoder consists of two recursive systematic convolutional encoders, RSC1 and RSC2. The RSC1 takes sequential data from the encoder data block and RSC2 takes interleaved data from the same data block. In this structure, three implementation cycles are required to get a single constellation point, which is mainly due to the implementation requirement of the turbo encoder.

Figure 2:
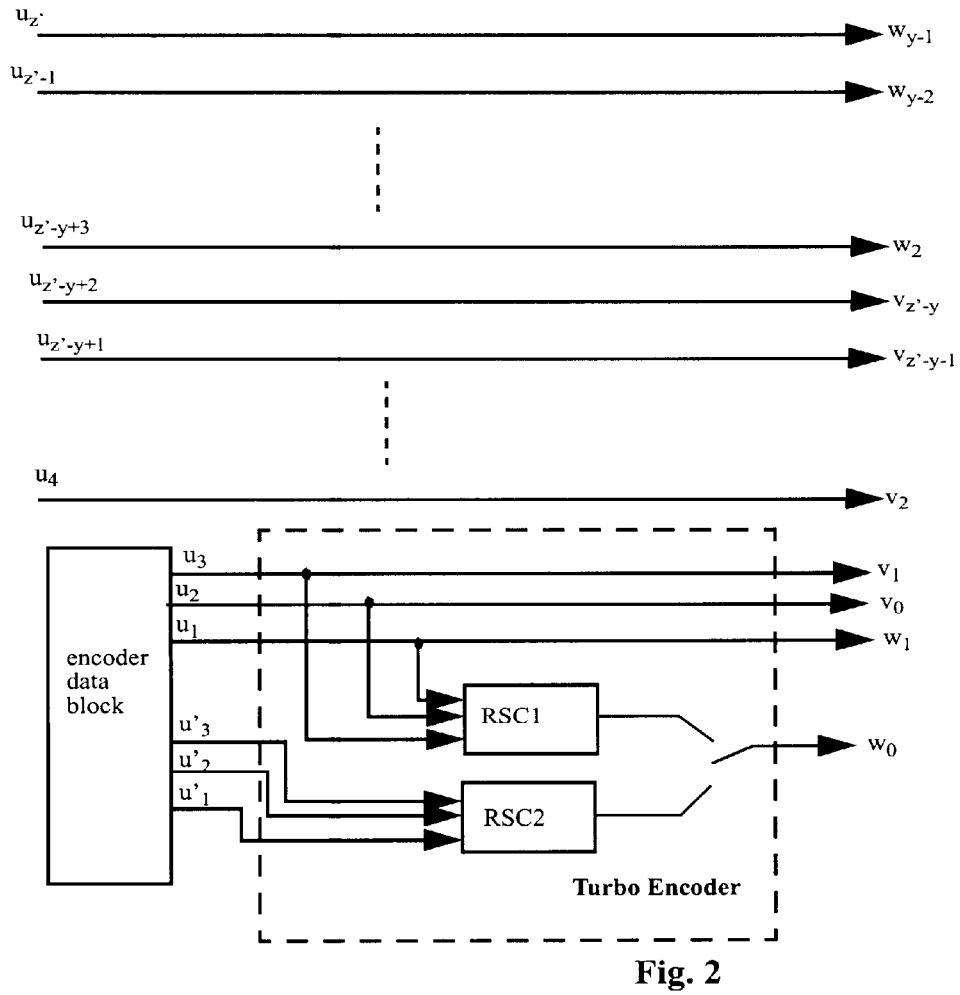
FIG. 2 is a block diagram of a parallel implementation of the encoder.

To speed up the process, a parallel encoder structure is presented in FIG. 2. The difference over FIG. 1 is that both RSC1 and RSC2 take three input data simultaneously and create one error check bit in a single implementation cycle.

Figure 3A:
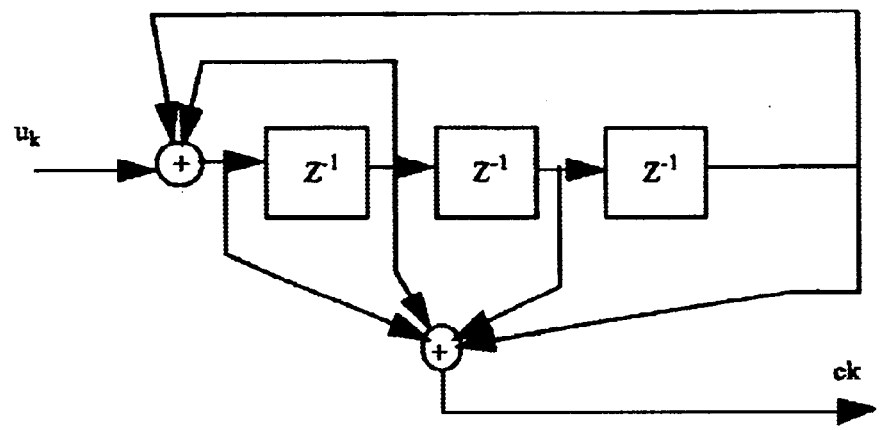
FIG. 3 shows a typical RSC encoder.
FIG. 3b shows a parallel RSC encoder in accordance with the principles of the invention.
Figure 3B:
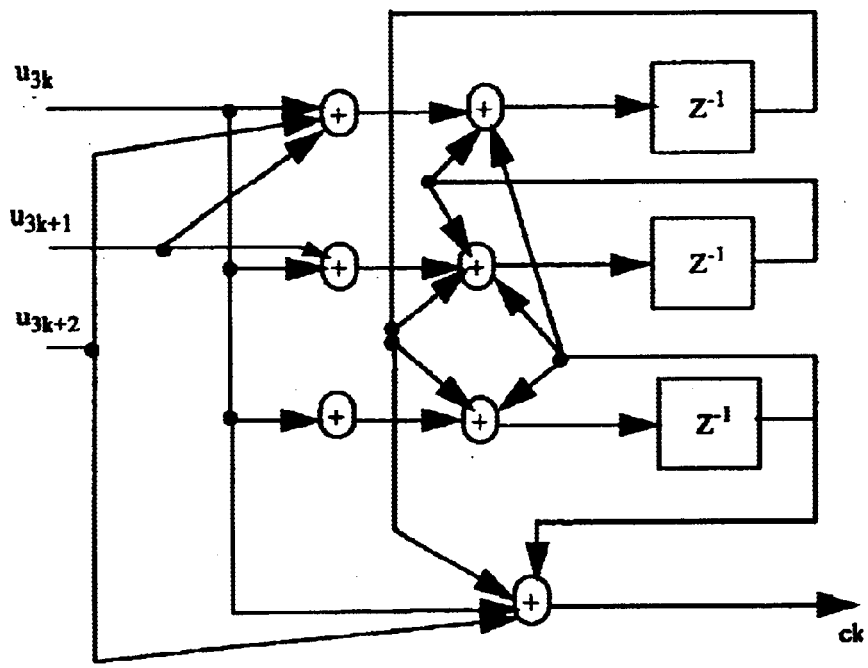

A comparison between a normal RSC encoder and a parallel RSC encoder is shown in FIG. 3, where FIG. 3(a) is a normal 8 state RSC encoder and FIG. 3(b) shows a parallel implementation. The parallel encoder takes only one implementation cycle for every three input bits. Although FIG. 3(b) shows the same encoder as FIG. 3(a), it is not necessary that the parallel encoder be derived from a normal RSC encoder.

Parallel Turbo Decoder

The decoding procedure for turbo trellis-coded modulation consists of following steps:

1. Soft decode for the least significant bit (LSB);
2. Hard decoder for the most significant bits (MSB).
3. Decode the LSB using turbo decoder algorithm
4. Determine all data bits.

In order to decode the LSB (third step), the parallel turbo decoder takes three soft-bit inputs for each forward ($\alpha$) and backward ($\beta$) iteration. In this way, only ⅓ cycles are used for each turbo decoder iteration and the memory requirements for storing $\alpha$ and $\beta$ values are also reduced by a factor of three.

Figure 4:
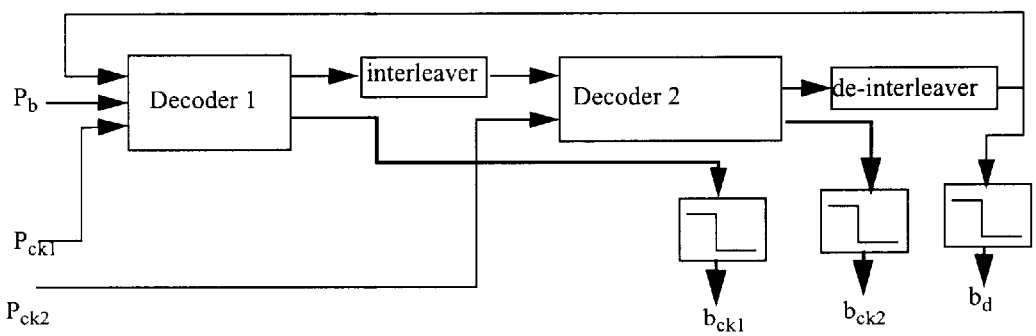
FIG. 4 is a block diagram of a parallel turbo decoder.

The parallel turbo decoder is shown in FIG. 4. It consists of two decoders 40, 42, and an interleaver 41, and de-interleaver 43.

Figure 5:
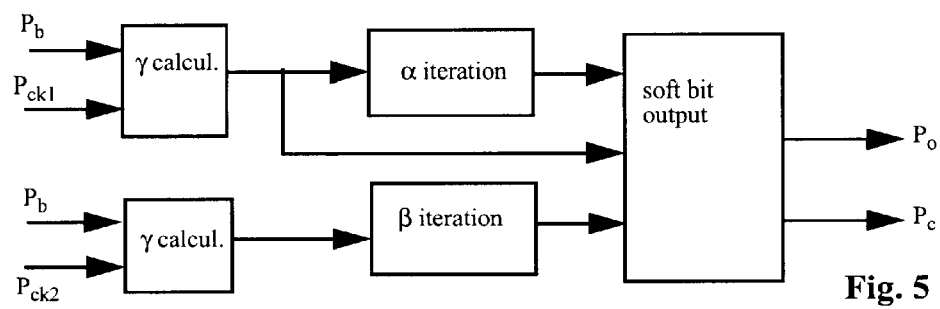
FIG. 5 illustrates the operation of the decoder.

FIG. 5 shows a detail of decoder 40 (decoder 42 has the same structure). The decoders 40, 42 consist of blocks for calculating $\gamma$ values, blocks for performing iteration, and a soft bit output block.

The first step in the decoding operation as shown in FIG. 5 is to take three soft bits $P_{3k}(0)$, $P_{3k}(1)$, $P_{3k+1}(0)$, $P_{3k+1}(1)$, $P_{3k+2}(0)$, $P_{3k+2}(1)$ to form eight probability values (a normal turbo decoder has only two values because it contains only one bit of information): $P^k000$, $P^k001$, $P^k010$, $P^k011$, $P^k100$, $P^k101$, $P^k110$, and $P^k111$. For example, $$P^k_{000} = \log[Prob(b_{3k} = 0, b_{3k+1} = 0, b_{3k+2} = 0)]$$
$$= P_{3k}(0) + P_{3k+1}(0) + P_{3k+2}(0)$$

In general,
$P^kj$ (j=mn1=000, 001, . . . , 111) can be obtained as $$P^k_{mnl} = \log[Prob(b_{3k} = m, b_{3k+1} = n, b_{3k+2} = 1)]$$
$$= P_{3k}(m) + P_{3k+1}(n) + P_{3k+2}(1)$$

With $p^kj$ and the corresponding error check bit ($P_{ck}(0)$, $P_{ck}(1)$), the value $\gamma_j(R_k, s', s)$ can be obtained as $$\gamma_j(R_k, s', s) = \log(Pr(d_k=j, S_k=s, R_k|S_{k-1}=s')) = P^k_j + P_{ck}(m)$$

where j=000, 001, . . . , 111 and m=0 or 1 depending on the error check bit when transferring from state s' to s. $R_k$ represents the received information.

Figure 6:
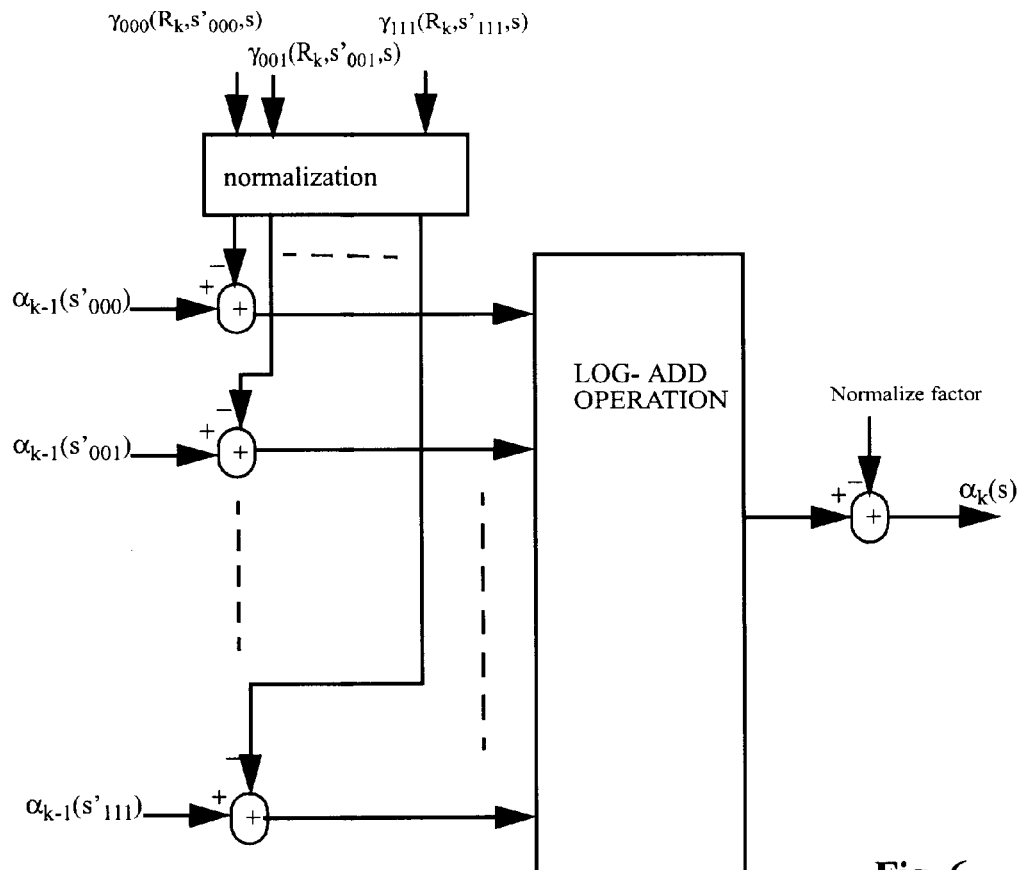
FIG. 6 illustrates the implementation of the forward iteration.

With $\gamma_j(R_k, s', s)$, the forward iteration ($\alpha$) iteration with LOG-MAP algorithm) can be implemented as shown in FIG. 6, where the normalization block puts all $\gamma_j(R_k, s', s)$ into the center of the dynamic range with the same normalization factor so that the whole dynamic range in a fixed point implementation can be utilized.

Figure 7:
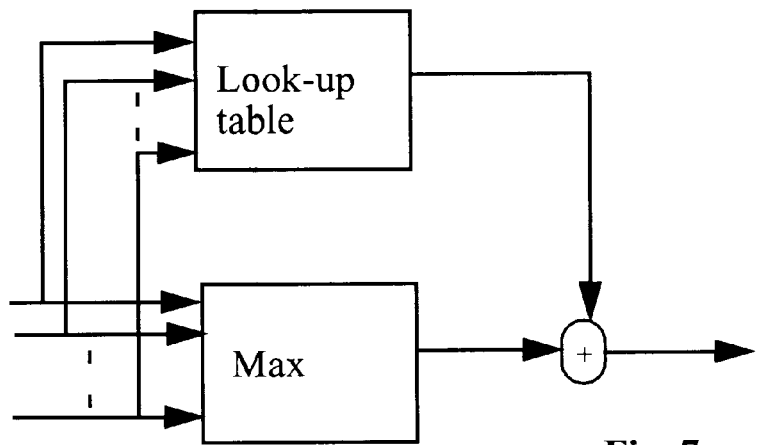
FIG. 7 shows a detail of FIG. 6.

The same principle is applied to the output $\alpha_k(s)$, i.e., all $\alpha_k(s)$ at different state s (for the same iteration k) are normalized with a same normalize factor so that they are all located in the center of dynamic range. The determination of normalization factor is the same as that used in the normal turbo decoder implementation. The difference in the forward iteration is that each state s at iteration k ($\alpha_k(s)$) is determined by eight previous states ($\alpha'_{k-1}(s'_{000})$, $\alpha'_{k-1}(s'_{001})$, . . . , $\alpha'_{k-1}(s'_{111})$), each corresponding one input $\gamma_j(R_k, s', s)$ value (in a conventional turbo decoder, each state at iteration k is determined by only two previous states because the input is only one bit information). The LOG-ADD OPERATION in FIG. 6 is shown in FIG. 7, which consists of a max operation and a look-up table.

Figure 8:
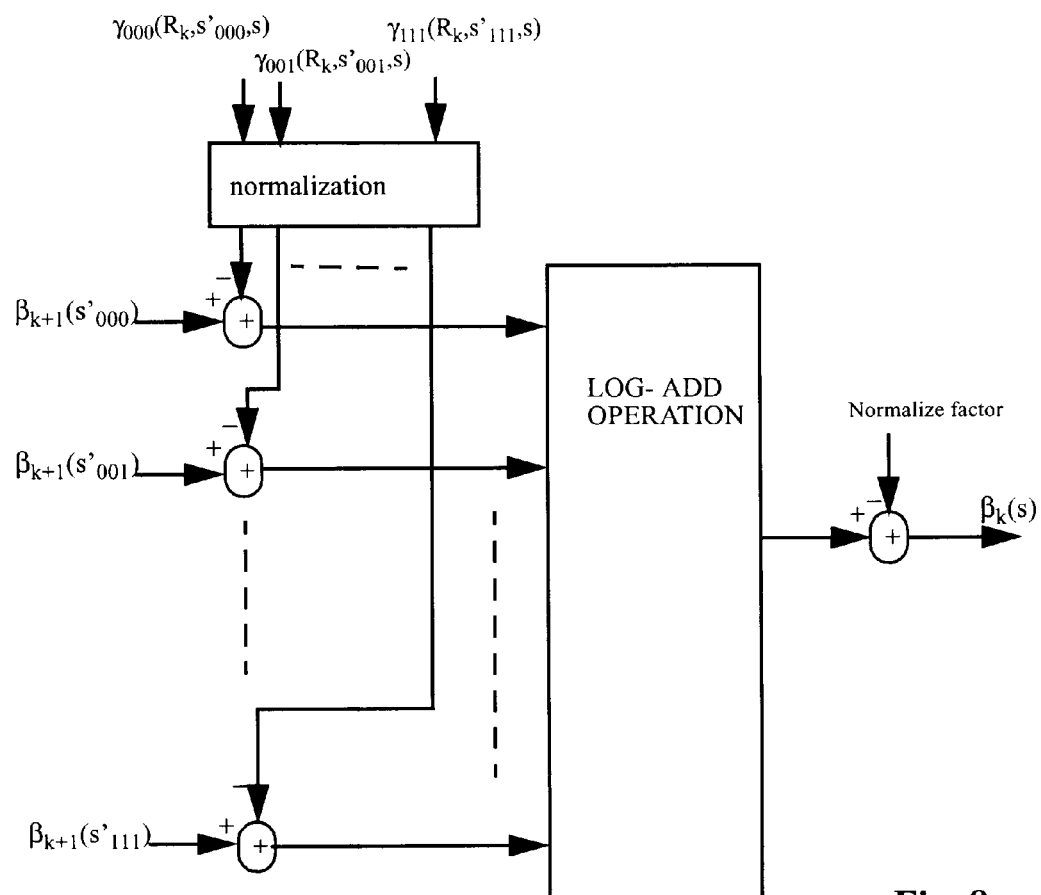
FIG. 8 illustrates the implementation of backward iteration.

The backward iteration has the same structure as the forward iteration and is shown in FIG. 8.

After finishing forward and backward iteration, the soft bit outputs are calculated in two steps as follows:

first calculate eight $P^k_j$ values for j=000, 001, . . . , 111 as $$P^k_j = MAX_{(s,\ s')}[\gamma_j(R_k, s, s')\alpha_{k-1}(s')\beta_k(s)]$$

Then the soft output is the combination of $P^{3k}_j$ values, such as $$P_o^{3k}(0) = prob(b_{3k}=0) = P_{000}^k + P_{010}^k + P_{100}^k + P_{110}^k$$
$$P_o^{3k}(1) = prob(b_{3k}=1) = P_{001}^k + P_{011}^k + P_{101}^k + P_{111}^k$$
$$P_o^{3k+1}(0) = prob(b_{3k}=1) = P_{000}^k + P_{001}^k + P_{100}^k + P_{101}^k$$
$$P_o^{3k+1}(1) = prob(b_{3k+1}=1) = P_{010}^k + P_{011}^k + P_{110}^k + P_{111}^k$$
$$P_o^{3k+2}(0) = prob(b_{3k+2}=0) = P_{000}^k + P_{001}^k + P_{010}^k + P_{011}^k$$
$$P_o^{3k+2}(1) = prob(b_{3k+2}=1) = P_{100}^k + P_{101}^k + P_{110}^k + P_{111}^k$$

At the last iteration, the soft error check bits are also outputted as:

$$P_c^{3k+2}(1) = prob(b_c^{3k+2} = 1) = MAX_{(s,s')}[\gamma_{ck1}(R_k, s, s')\alpha_{k-1}(s')\beta_k(s)]$$
$$P_c^{3k+2}(0) = prob(b_c^{3k+2} = 0) = MAX_{(s,s')}[\gamma_{ck0}(R_k, s, s')\alpha_{k-1}(s')\beta_k(s)]$$

where $\gamma_{ck0}(R_k, s, s')$ and $\gamma_{ck1}(R_k, s, s')$ represent the transferring probability from state s' to s with error check bit (at time 3k+2) being 0 and 1 respectively.

The blocks described above can be implemented in a digital signal processor using standard digital processing techniques known to persons skilled in the art of digital signal processing.

The described techniques increase the implementation speed of the turbo encode and decoder and result in significant memory savings in the parallel decoder.

The invention is applicable to a decoder with a variable coding rate.

I claim:

1. An encoder for turbo coded trellis code modulation comprising an encoder data block for storing incoming data, and at least two parallel recursive systematic convolutional encoders, said recursive systematic convolutional encoders being connected to receive data in parallel from said encoder data block, and wherein each said parallel recursive systematic convolutional encoder comprises a first set of adders, each adder connected to receive a plurality of data streams from said encoder block, a second set of adders connected to the outputs of the respective adders of the first set of adders, and delay units for feeding the outputs of said second set of adders to their inputs in a recursive arrangement.

2. An encoder as claimed in claim 1, wherein each said parallel recursive systematic convolutional encoder further comprises a further adder connected to receive the some of said data streams from said encoder block and the outputs of some of said delay units, the output of said further adder providing the output of said recursive systematic convolutional encoders.

3. An encoder as claimed in claim 1, wherein said output represents an error check bit.

4. An encoder as claimed in claim 1, wherein said data streams represent the least significant bits of said encoded data.

5. Decoding apparatus for a turbo coded trellis code modulation signal, comprising a pair of decoders performing forward and backward iteration on an input signal, and interleaver and de-interleaver, said decoders being programmed to first obtain the values $\gamma_j(R_k, s', s)$, where $$\gamma_j(R_k, s', s) = \log(Pr(d_k=j, S_k=s, R_k|S_{k-1}=s')) = P^k_j + P_{ck}(m)$$

normalize the values $\gamma_j(R_k, s', s)$, wherein all the values $\gamma_j(R_k, s', s)$ are normalized with the same normalization factor so that they are located in the center of dynamic range to permit the use of fixed point implementation;

perform forward and backward iteration on the values $\gamma_j(R_k, s', s)$;

take a number n of soft input bits, where n is an integer greater than 1;

determine the probability values for the possible combinations of said n bits; and perform forward and backward iteration on said input bits in parallel to generate the decoded output.

6. Decoding apparatus as claimed in claim 5, wherein said decoders calculates $2^n$ probability values and obtains the corresponding error check bit therefrom.

7. Decoding apparatus as claimed in claim 6, wherein each decoder comprises a normalization unit and a unit for performing a log-add operation to perform said iteration.

8. Decoding apparatus as claimed in claim 7, wherein said unit for performing a log-add operation comprises a look-up table and a maximum operation unit.

9. A method of decoding a turbo trellis coded modulation signal comprising:

comprising first obtaining the values $\gamma_j(R_k, s', s)$, where $$\gamma_j(R_k, s', s) = \log(Pr(d_k=j, S_k=s, R_k|S_{k-1}=s')) = P_j^k + P_{ck}(m)$$

normalizing the values $\gamma_j(R_k, s', s)$, wherein all the values $\gamma_j(R_k, s', s)$ are normalized with the same normalization factor so that they are located in the center of dynamic range to permit the use of fixed point implementation;

performing forward and backward iteration on the values $\gamma_j(R_k, s', s)$;

taking a number n of soft input bits, where n is an integer greater than 1;

determining the probability values for the possible combinations of said n bits; and performing forward and backward iteration on said input bits in parallel to generate the decoded output.

10. A method as claimed in claim 9, wherein in the forward iteration, each state $k(\alpha_k(s))$ is determined by $2^n$ previous states.

11. A method as claimed in claim 9, wherein n is 3.

12. A method as claimed in claim 11, wherein after performing forward and backward iteration, the soft bit outputs are calculated in two steps as follows:

(i) first calculate eight $P_j^k$ values for j=000, 001, ..., 111 as $$P_j^k = \text{MAX}_{(s, s')}[\gamma_j(R_k, s, s')\alpha_{k-1}(s')\beta_k(s)]$$

(ii) then derive the soft output as the combination of $P_j^{3k}$ values, such as $$P_o^{3k}(0) = \text{prob}(b_{3k}=0) = P_{000}^k + P_{010}^k + P_{100}^k + P_{110}^k$$

$$P_o^{3k}(1) = \text{prob}(b_{3k}=1) = P_{001}^k + P_{011}^k + P_{101}^k + P_{111}^k$$

$$P_o^{3k+1}(0) = \text{prob}(b_{3k}=1) = P_{000}^k + P_{001}^k + P_{100}^k + P_{101}^k$$

$$P_o^{3k+1}(1) = \text{prob}(b_{3k+1}=1) = P_{010}^k + P_{011}^k + P_{110}^k + P_{111}^k$$

$$P_o^{3k+2}(0) = \text{prob}(b_{3k+2}=0) = P_{000}^k + P_{001}^k + P_{010}^k + P_{011}^k$$

$$P_o^{3k+2}(1) = \text{prob}(b_{3k+2}=1) = P_{100}^k + P_{101}^k + P_{110}^k + P_{111}^k.$$

13. A method as claimed in claim 12, wherein at the last iteration, the soft error check bits are also outputted as:

$$P_c^{3k+2}(1) = prob(b_c^{3k+2} = 1) = \text{MAX}_{(s,s')}[\gamma_{ck1}(R_k, s, s')\alpha_{k-1}(s')\beta_k(s)]$$

$$P_c^{3k+2}(0) = prob(b_c^{3k+2} = 0) = \text{MAX}_{(s,s')}[\gamma_{ck0}(R_k, s, s')\alpha_{k-1}(s')\beta_k(s)]$$

where $\gamma_{ck0}(R_k, s, s')$ and $\gamma_{ck1}(R_k, s, s')$ represent the transferring probability from state s' to s with error check bit (at time 3k+2) being 0 and 1 respectively.

14. A turbo trellis coded modulation signal decoding method, comprising:

first obtaining the values $\gamma_j(R_k, s', s)$, where $$\gamma_j(R_k, s', s) = \log(Pr(d_k=j, S_k=s, R_k|S_{k-1}=s')) = P_j^k + P_{ck}(m)$$

normalizing the values $\gamma_j(R_k, s', s)$, wherein all the values $\gamma_j(R_k, s', s)$ are normalized with the same normalization factor so that they are located in the center of dynamic range to permit the use of fixed point implementation;

performing forward and backward iteration on the values $\gamma_j(R_k, s', s)$;

taking a number n of soft input bits, where n is an integer greater than 1;

determining the probability values for the possible combinations of said n bits; and performing forward and backward iteration on said input bits in parallel to generate the decoded output.

* * * * *